US010355199B2

(12) United States Patent
Lee et al.

(10) Patent No.: US 10,355,199 B2
(45) Date of Patent: Jul. 16, 2019

(54) ELECTRONIC DEVICE HAVING A LOWER CONTACT STRUCTURE WITH SIDEWALL SPACERS

(71) Applicant: SK hynix Inc., Icheon-Si (KR)

(72) Inventors: Hyung-Suk Lee, Icheon-si (KR); Do-Yeon Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/824,940

(22) Filed: Nov. 28, 2017

(65) Prior Publication Data

US 2018/0226567 A1    Aug. 9, 2018

(30) Foreign Application Priority Data

Feb. 3, 2017  (KR) .......................... 10-2017-0015426

(51) Int. Cl.
*H01L 43/02* (2006.01)
*H01L 43/08* (2006.01)
*H01L 43/10* (2006.01)
*H01L 43/12* (2006.01)
*H01L 27/22* (2006.01)

(52) U.S. Cl.
CPC ............ *H01L 43/02* (2013.01); *H01L 27/222* (2013.01); *H01L 43/08* (2013.01); *H01L 43/10* (2013.01); *H01L 43/12* (2013.01); *H01L 27/228* (2013.01)

(58) Field of Classification Search
CPC ......... H01L 43/02; H01L 43/08; H01L 43/10; H01L 43/12; H01L 27/228
See application file for complete search history.

(56) References Cited

U.S. PATENT DOCUMENTS

| 8,502,186 | B2* | 8/2013 | Chung | ............... H01L 27/2463 257/295 |
| 8,878,273 | B2* | 11/2014 | Kim | ................. H01L 27/10876 257/306 |
| 9,515,250 | B2* | 12/2016 | Ha | .......................... H01L 43/02 |
| 9,634,011 | B2* | 4/2017 | Kang | ............... H01L 27/10814 |
| 2014/0284743 | A1 | 9/2014 | Aikawa et al. | |
| 2015/0249206 | A1* | 9/2015 | Kim | ....................... H01L 43/02 257/421 |

(Continued)

FOREIGN PATENT DOCUMENTS

| KR | 10-2014-0026155 | 3/2014 |
| KR | 10-2015-0082899 | 7/2015 |
| KR | 10-2016-0035984 | 4/2016 |

*Primary Examiner* — Ida M Soward
(74) *Attorney, Agent, or Firm* — Perkins Coie LLP

(57) ABSTRACT

An electronic device may include a semiconductor memory, and the semiconductor memory may include a substrate; an interlayer dielectric layer formed over the substrate and patterned to include a contact hole; a lower contact structure formed over the substrate in the contact hole; and a variable resistance element formed over and electrically coupled to the lower contact structure, wherein the lower contact structure comprises: a spacer formed on sidewalls of the contact hole in the interlayer dielectric layer and including a material having a lower etch rate than that of silicon nitride (SiN); a contact plug filling a portion of the contact hole; and a contact pad formed over the contact plug and filling a remaining portion of the contact hole.

12 Claims, 11 Drawing Sheets

(56) References Cited

U.S. PATENT DOCUMENTS

| | | | |
|---|---|---|---|
| 2015/0364681 A1* | 12/2015 | Murase | H01L 45/1233 257/4 |
| 2016/0005953 A1* | 1/2016 | Lee | H01L 43/08 711/126 |
| 2016/0043300 A1* | 2/2016 | Kim | H01L 43/08 711/125 |
| 2016/0149121 A1* | 5/2016 | Oh | H01L 43/10 711/104 |
| 2016/0308121 A1* | 10/2016 | Kim | H01L 43/08 |
| 2017/0012198 A1* | 1/2017 | Huang | H01L 45/1253 |
| 2017/0047421 A1* | 2/2017 | Oh | H01L 29/7827 |
| 2017/0062712 A1* | 3/2017 | Choi | H01L 45/1233 |
| 2017/0236919 A1* | 8/2017 | Kim | H01L 21/3065 438/586 |
| 2018/0097173 A1* | 4/2018 | Chuang | H01L 43/02 |
| 2018/0122854 A1* | 5/2018 | Lee | H01L 27/222 |
| 2018/0218945 A1* | 8/2018 | Moon | H01L 21/76816 |

\* cited by examiner

ELECTRONIC DEVICE HAVING A LOWER CONTACT STRUCTURE WITH SIDEWALL SPACERS

CROSS-REFERENCE TO RELATED APPLICATION

This patent document claims priority of Korean Patent Application No. 10-2017-0015426, entitled "ELECTRONIC DEVICE AND METHOD FOR FABRICATING THE SAME" and filed on Feb. 3, 2017, which is incorporated herein by reference in its entirety.

TECHNICAL FIELD

This patent document relates to memory circuits or devices, methods for fabricating the same and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In one aspect, an electronic device may include a semiconductor memory, and the semiconductor memory may include a substrate; an interlayer dielectric layer formed over the substrate and patterned to include a contact hole; a lower contact structure formed over the substrate in the contact hole; and a variable resistance element formed over and electrically coupled to the lower contact structure, wherein the lower contact structure may include: a spacer formed on sidewalls of the contact hole in the interlayer dielectric layer and including a material having a lower etch rate than that of silicon nitride (SiN); a contact plug filling a portion of the contact hole; and a contact pad formed over the contact plug and filling a remaining portion of the contact hole.

Implementations of the above electronic device may include one or more the following.

The variable resistance element may include an MTJ (magnetic tunnel junction) structure including a free layer having a variable magnetization direction, a pinned layer having a fixed magnetization direction and a tunnel barrier layer interposed between the free layer and the pinned layer. The spacer may be in contact with the MTJ structure at a lower portion of the MTJ structure. The spacer may include SiBN, SiCN, or SiBCN, or a combination thereof. The MTJ structure may include boron in a lower portion of the MTJ structure, the boron being diffused from the spacer. The spacer may have a substantially uniform thickness along a direction perpendicular to a surface of the substrate. The contact plug and the contact pad may include a metal-containing material. The contact plug may include tungsten (W), or titanium nitride (TiN), or a combination thereof, and the contact pad includes tantalum (Ta).

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory may include: forming an interlayer dielectric layer over a substrate and patterning the interlayer dielectric layer to include a contact hole; forming a lower contact structure over the substrate in the contact hole; and forming a variable resistance element over the lower contact structure, wherein the forming of the lower contact structure may include: forming a spacer by depositing a material layer including a material having a lower etch rate than that of SiN on sidewalls of the contact hole; forming a contact plug filling a portion of the contact hole; and forming a contact pad filling a remaining portion of the contact hole over the contact plug.

Implementations of the above method for fabricating the electronic device may include one or more the following.

The forming of the variable resistance element may include forming an MTJ (Magnetic Tunnel Junction) structure including a free layer having a variable magnetization direction, a pinned layer having a fixed magnetization direction, and a tunnel barrier layer interposed therebetween. The spacer may be in contact with the MTJ structure at a lower portion of the MTJ structure. The spacer may include SiBN, SiCN, or SiBCN, or a combination thereof. The MTJ structure may include boron diffused from the spacer to a lower portion of the MTJ structure. The spacer may have a uniform thickness along a vertical direction. The contact plug and the contact pad may include a metal-containing material. The contact plug may include tungsten (W), or titanium nitride (TiN), or a combination thereof, and the contact pad includes tantalum (Ta).

In further another aspect, an electronic device may include a semiconductor memory, wherein the semiconductor memory may include a substrate; a lower contact structure formed over the substrate; a spacer formed on a sidewall of the lower contact and having a thickness that is uniform along a direction perpendicular to a surface of the substrate; and a variable resistance element formed over and electrically coupled to the lower contact structure, the variable resistance element configured to exhibit different resistance values depending on a direction of current flowing through the variable resistance element.

The spacer may include a material having a lower etch rate than that of silicon nitride (SiN). The spacer may have a substantially rectangular cross-section. The spacer may include SiBN, SiCN, or SiBCN, or a combination thereof. The variable resistance element may include a free layer having a variable magnetization direction, a pinned layer having a fixed magnetization direction and a tunnel barrier layer interposed between the free layer and the pinned layer.

These and other aspects, implementations and associated advantages are described in greater detail in the drawings, the description and the claims.

DETAILED DESCRIPTION

Figure 1A:
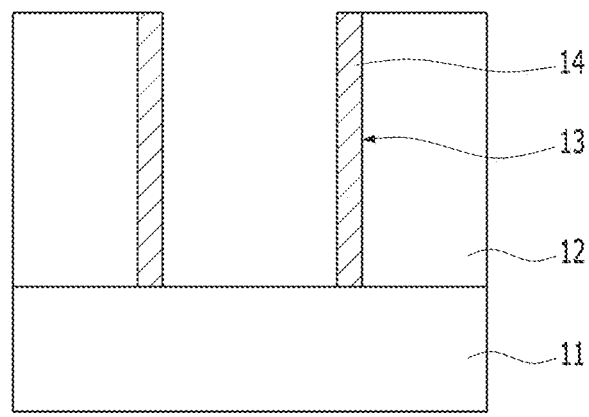
FIGS. 1A to 1C are cross-sectional views illustrating a method for forming a lower contact structure of a variable resistance element in accordance with a comparative example.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer substrate may not reflect all layers present in that particular multilayer substrate (e.g., one or more additional layers may be present between two illustrated layers). As a specific example, when a first layer in a described or illustrated multi-layer substrate is referred to as being "on"

or "over" a second layer or "on" or "over" a substrate, the first layer may be directly formed on the second layer or the substrate but may also represent a substrate where one or more other intermediate layers may exist between the first layer and the second layer or the substrate.

A variable resistance element may mean an element capable of being switched between different resistance states in response to an applied bias (for example, a current or voltage). The variable resistance element may store different data according to the resistance state. That is, the variable resistance element may function as a memory cell. The memory cell may further include a selecting element coupled to the variable resistance element and controlling an access to the variable resistance element. Such memory cells may be arranged in various way to form a semiconductor memory.

In some implementations, the variable resistance element may include an MTJ (Magnetic Tunnel Junction) structure which includes a free layer having a variable magnetization direction, a pinned layer having a fixed magnetization direction and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to thereby store different data based on the different resistance states. The disclosed technology and its implementations can be used to provide an improved variable resistance element capable of satisfying or enhancing various characteristics required for the variable resistance element.

Prior to explaining implementations of the present disclosure, a lower contact structure of a variable resistant element in accordance with a comparative example will be explained.

Figure 1B:
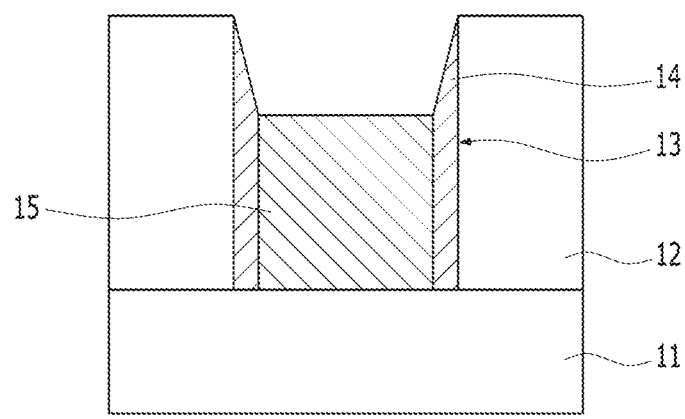
Figure 1C:
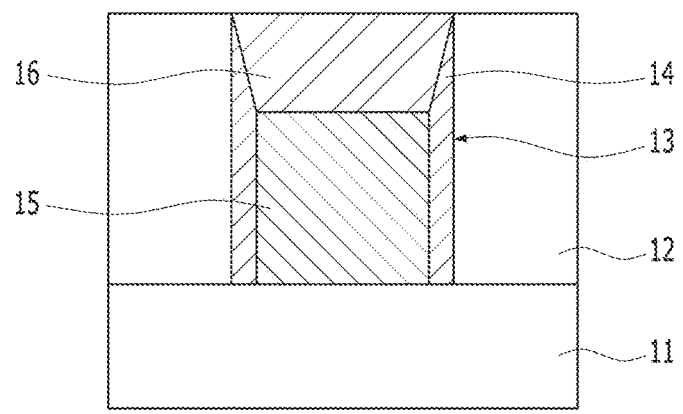

FIGS. 1A to 1C are cross-sectional views illustrating a lower contact structure of a variable resistance element in accordance with a comparative example.

Referring to FIG. 1A, an interlayer dielectric layer 12 may be formed over a substrate 11 where a predetermined structure, for example, a switching element (not shown) is formed.

Then, the interlayer dielectric layer 12 may be selectively etched to form a contact hole 13 exposing a portion of the substrate 11. Subsequently, a spacer 14 may be formed by depositing silicon nitride (SiN) on sidewalls of the contact hole 13.

Referring to FIG. 1B, a contact plug 15 including titanium nitride (TiN) may be formed. The contact plug 15 may fill a portion of the contact hole 13 having sidewalls on which the spacer 14 is formed. The contact plug 15 may be formed by depositing titanium nitride (TiN) on a front surface of the substrate 11 so as to fill the contact hole 13 and sequentially performing an etch-back process and a cleaning process.

When performing the etch-back process and the cleaning process, as shown in FIG. 1B, an upper portion of the spacer 14 formed on the sidewalls of the contact hole 13 may be partially removed so that the spacer 14 has a shape in which the upper portion is narrower than the lower portion. In FIG. 1B, the spacer 14 has a thickness decreasing along an upward direction from a top surface of the contact plug.

Referring to FIG. 1C, a contact pad 16 filling a remaining portion of the contact hole 13 may be formed on the contact plug 15. The contact pad 16 may include a tantalum (Ta)-containing layer in some implementations. Since the upper portion of the spacer 14 is partially removed in the previous process, the contact pad 16 may be formed so as to have a cross-section in which an upper portion is wider than a lower portion, instead of a rectangular cross-section.

In the illustrated example, this lower contact structure has a shape in which the upper portion is wider than the lower portion. Accordingly, in a chemical mechanical polishing (CMP) process performed after depositing material layers for forming the contact pad 16, a CD (critical dimension) variation may occur due to a difference of step heights, and, as a result, a resistance variation of the variable resistance element may be caused. Moreover, in a subsequent etch process for an MTJ (Magnetic Tunnel Junction) structure formed over the lower contact structure, metallic residues may be redeposited on sidewalls of the MTJ structure due to an influence of a physical etch process so as to cause a shunt failure which is fatal to driving the variable resistance element and thus deteriorate characteristics of the variable resistance element.

Some implementations for the disclosed technology can be designed to provide a memory device including a variable resistance element having a lower contact structure which is capable of improving characteristics of the variable resistance element by preventing a CD variation due to a difference of step heights in a CMP process and a resistance variation of the variable resistance element. Advantageously, such implementations cause no redeposition of metallic residues during an etch process for an MTJ structure.

Figure 2:
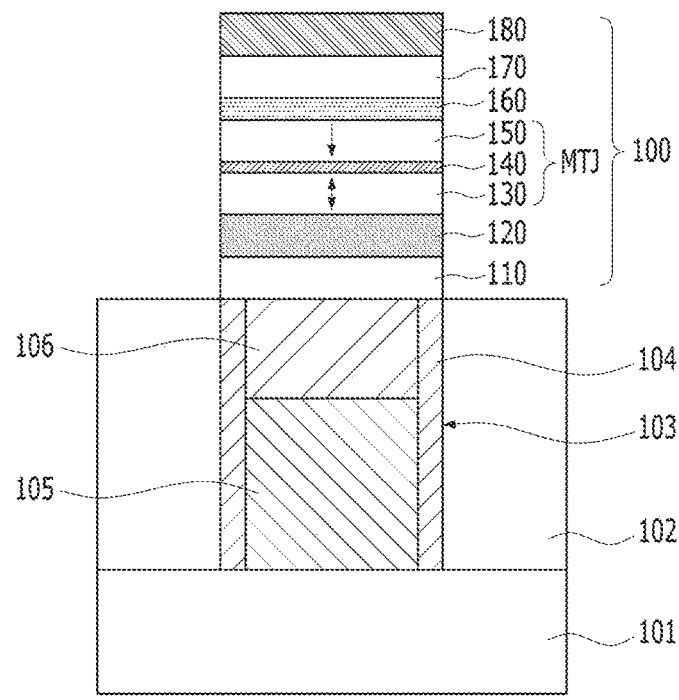
FIG. 2 is a cross-sectional view of an exemplary memory device in accordance with an implementation of the present disclosure.

FIG. 2 is a cross-sectional view illustrating a memory device in accordance with an implementation of the present disclosure.

As shown in FIG. 2, the memory device in accordance with the implementation of the present disclosure may include a substrate 101 including a predetermined structure, an interlayer dielectric layer 102 formed over the substrate 101 and patterned to include a contact hole 103, a spacer 104 formed on sidewalls of the contact hole 103 in the interlayer dielectric layer 102, a contact plug 105 filling a portion of the contact hole 103, a contact pad 106 formed over the contact plug 105 and filling a remaining portion of the contact hole 103; and a variable resistance element 100 formed over and electrically coupled to the contact pad 106.

The substrate 101 may include a semiconductor substrate. The semiconductor substrate may be in a single crystal state and include a silicon-containing material. For example, the semiconductor substrate may include a single-crystalline silicon-containing material. For example, the substrate 101 may include a bulk silicon substrate, or a SOI (Silicon On Insulator) substrate in which a support substrate, a buried insulating layer and a single-crystalline silicon layer are sequentially stacked.

The predetermined structure formed over the substrate 101 may include a switching element (not shown). The switching element may be connected to the variable resistance element 100 and serve to control the supply of a bias to the variable resistance element 100. The switching element may include a transistor, or a diode, etc. The switching element may be electrically connected to the contact plug 105 at a portion of the switching element and to a conductive line, e.g., a source line (not shown), at another portion of the switching element.

The interlayer dielectric layer 102 may include any one or a combination of two or more of an oxide layer, a nitride layer, or an oxynitride layer.

The contact plug 105 may fill a portion of the contact hole 103 and include a metal-containing material having an excellent filling property and electrical conductivity. For example, the contact plug 105 may include tungsten (W), or titanium nitride (TiN), etc.

The contact pad 106 may include a variety of material layers for various purposes including improving characteristics of the variable resistance element 100, making the fabrication process easier, providing an electrode for the variable resistance element 100, or reducing a contact resistance between the contact plug 105 and the variable resistance element 100. For example, the contact pad 106 may include a tantalum (Ta)-containing material and operate as a tantalum layer.

The spacer 104 may be formed on the sidewalls of the contact hole 103 and have a substantially uniform thickness in an upper portion and a lower portion so as to have a substantially rectangular cross-section.

The spacer 104 may include a material having a lower etch rate than that of SiN. In the implementation, by forming the spacer 104 of a material having a lower etch rate than that of SiN, it is possible to prevent or minimize the loss of an upper portion of a material layer for the spacer 104 during a subsequent process, for example, a deposition process of a material layer, an etch-back process and a cleaning process during forming the contact plug 105 in comparison with the comparative example in which the spacer 104 is formed of or includes SiN.

Some implementations, the spacer 104 may include SiBN, SiCN, or SiBCN, or a combination thereof. SiBN, SiCN and SiBCN can form a hard film so as to have a lower etch rate. Accordingly, in the implementations, by forming the spacer 104 from a material layer including SiBN, SiCN, or SiBCN, or a combination thereof, it is possible to prevent or minimize the loss of an upper portion of a material layer for the spacer 104 during a subsequent process, for example, a deposition process of a material layer, an etch-back process or a cleaning process during forming the contact plug 105. As a result, the spacer 104 may have a substantially uniform thickness along a vertical direction. For example, the spacer 104 may have a substantially rectangular cross-section.

Therefore, it is possible to provide the contact pad 106 which is to be formed in the subsequent process such that the upper portion of the contact pad 106 has a substantially same thickness as the lower portion of the contact pad 106 and the widening of its upper portion is prevented or minimized. As a result, the contact pad 106 may have a substantially rectangular cross-section.

Consequently, in accordance with the implementation, the resultant lower contact structure may have a shape in which the upper portion and the lower portion have substantially same size as each other so as to have a substantially rectangular cross-section.

The variable resistance element 100 may include an MTJ structure including a free layer 130 having a variable magnetization direction, a pinned layer 150 having a fixed magnetization direction, and a tunnel barrier layer 140 interposed between the free layer 130 and the pinned layer 150.

The free layer 130 may have a variable magnetization direction that causes the MTJ structure to have a variable resistance value. With the change of the magnetization direction of the free layer 130, the relative relationship of the magnetization directions of the free layer 130 and the pinned layer 150 also changes, which allows the variable resistance element 100 to store different data or represent different data bits. The free layer 130 may also be referred as a storage layer or the like. The magnetization direction of the free layer 130 may be substantially perpendicular to a surface of the free layer 130, the tunnel barrier layer 140 and the pinned layer 150. In other words, the magnetization direction of the free layer 130 may be substantially parallel to stacking directions of the free layer 130, the tunnel barrier layer 140 and the pinned layer 150. Therefore, the magnetization direction of the free layer 130 may be changed between a downward direction and an upward direction. The change in the magnetization direction of the free layer 130 may be induced by spin transfer torque. The free layer 130 may have a single-layer or multilayer structure including a ferromagnetic material. For example, the free layer 130 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or the like, or may include a stack of metals, such as Co/Pt, or Co/Pd, or the like.

The tunnel barrier layer 140 may allow the tunneling of electrons in both data reading and data writing operations. In a write operation for storing new data, a high write current may be directed through the tunnel barrier layer 140 to change the magnetization direction of the free layer 130 and thus to change the resistance state of the MTJ for writing a new data bit. In a reading operation, a low reading current may be directed through the tunnel barrier layer 140 without changing the magnetization direction of the free layer 130 to measure the existing resistance state of the MTJ under the existing magnetization direction of the free layer 130 to read the stored data bit in the MTJ. It may include a dielectric oxide, for example, an oxide such as MgO, CaO, SrO, TiO, VO, or NbO or the like.

The pinned layer 150 may have a pinned magnetization direction which contrasts with the magnetization direction of the free layer 130, and may be referred to as a reference layer or the like. In FIG. 2, the magnetization direction of the pinned layer 150 may be pinned in a downward direction. Alternatively, unlike that shown in FIG. 2, the magnetization direction of the pinned layer 150 may be pinned in an upward direction. The pinned layer 150 may have a single-layer or multilayer structure including a ferromagnetic material. For example, the pinned layer 150 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or the like.

If a voltage or current is applied to the variable resistance element 100, the magnetization direction of the free layer 130 may be changed by spin torque transfer. When the magnetization directions of the free layer 130 and the pinned layer 150 are parallel to each other, the variable resistance element 100 may be in a low resistance state to store a particular designated digital data bit such as '0'. Conversely, when the magnetization directions of the free layer 130 and the pinned layer 150 are anti-parallel to each other, the variable resistance element 100 may be in a high resistance state to store a different designated digital data bit such as '1'.

In some implementations, the variable resistance element 100 may further include one or more layers performing various functions to improve a characteristic of the MTJ structure. For example, the variable resistance element 100 may further include a buffer layer 110, an under layer 120, a spacer layer 160, a magnetic correction layer 170 or a capping layer 180, or a combination thereof.

The under layer 120 may be disposed under the free layer 130 and serve to improve perpendicular magnetic crystalline anisotropy of the free layer 130.

The buffer layer 110 may be disposed under the under layer 120 and aid in crystal growth of the under layer 120. When the buffer layer 110 is formed under the under layer 120, it is possible to aid in crystal growth of the under layer 120 and thus improve perpendicular magnetic crystalline anisotropy of the free layer 130.

The magnetic correction layer 170 may serve to offset the effect of the stray magnetic field produced by the pinned layer 150. In this case, the effect of the stray magnetic field of the pinned layer 150 can decrease, and thus a biased magnetic field in the free layer 130 can decrease. The magnetic correction layer 170 may have a magnetization direction anti-parallel to the magnetization direction of the pinned layer 150. In the implementation, when the pinned layer 150 has a downward magnetization direction, the magnetic correction layer 170 may have an upward magnetization direction. Conversely, when the pinned layer 150 has an upward magnetization direction, the magnetic correction layer 170 may have a downward magnetization direction. The magnetic correction layer 170 may have a single-layer or multilayer structure including a ferromagnetic material.

In this implementation, the magnetic correction layer 170 is located above the pinned layer 150, but the position thereof may be changed. For example, the magnetic correction layer 170 may also be located above, below, or next to the MTJ structure while it is patterned separately from the MTJ structure.

The spacer layer 160 may be interposed between the magnetic correction layer 170 and the pinned layer 150 and function as a buffer therebetween. Further, the spacer layer 160 may serve to improve characteristics of the magnetic correction layer 170. The spacer layer 160 may include a noble metal such as ruthenium (Ru).

The capping layer 180 may function as a hard mask for patterning the variable resistance element 100 and include various conductive materials such as a metal. In some implementations, the capping layer 180 may include a metallic material having a few pin holes and high resistance to wet and/or dry etching. For example, the capping layer 180 may include a noble metal such as ruthenium (Ru).

In one implementation, by forming the spacer 104 of a material having a lower etch rate than that of SiN, for example, SiBN, SiCN, SiBCN, or a combination thereof, it is possible to a final spacer 104 with a substantially uniform thickness in its upper portion and its lower portion during subsequent processes including a deposition process of a material layer, an etch-back process and a cleaning process for forming the contact plug 105. Accordingly, in some implementations, the spacer 104 can be formed to have a substantially rectangular cross-section.

As a result, it is possible to prevent or minimize a CD variation due to a difference of step heights in a subsequent CMP process, thereby preventing a resistance variation of the variable resistance element. Moreover, in a subsequent etch process for the MTJ structure, it is possible to prevent redeposition of metallic residues due to an influence of a physical etch process, and thus to prevent or minimize a shunt failure. Consequently, deterioration of characteristics of the variable resistance element can be prevented.

Advantages which can be obtained by forming the spacer 104 of a material having a lower etch rate than that of SiN, for example, SiBN, SiCN, or SiBCN, or a combination thereof will be described in detail with reference to FIGS. 3A, 3B, 4A and 4B.

Figure 3A:
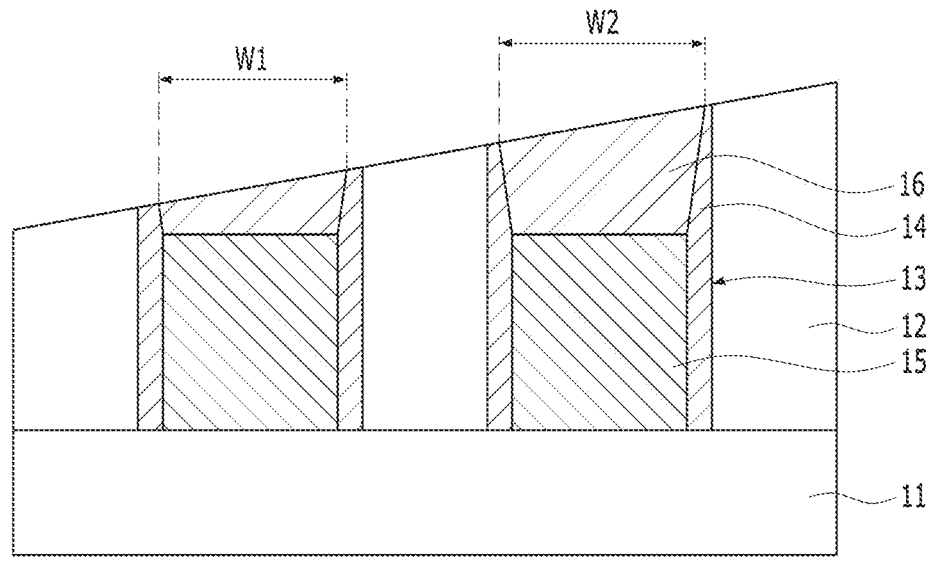
FIGS. 3A and 3B are cross-sectional views of lower contact structures in accordance with a comparative example and one implementation of the present disclosure, which illustrate a CD (critical dimension) variation due to a difference of step heights in a subsequent CMP (Chemical Mechanical Planarization) process.
Figure 3B:
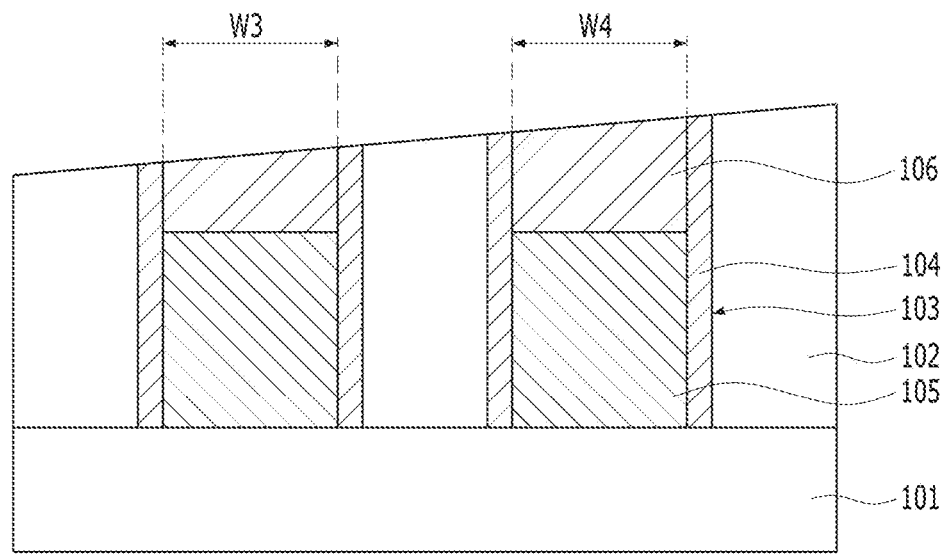

FIGS. 3A and 3B are cross-sectional views of lower contact structures in accordance with a comparative example and one implementation of the present disclosure, which illustrate a CD variation that may occur in a subsequent CMP process. FIG. 3A shows the lower contact structure in accordance with the comparative example as shown in FIGS. 1A to 1C, in which the material layer for the spacer 14 includes SiN so that an upper portion of the spacer 14 is partially removed after performing the subsequent process and thus an upper portion of the contact pad 16 has a greater width than that of the lower portion. FIG. 3B shows the lower contact structure in accordance with the implementation of the disclosed technology, in which the material layer for the spacer 104 includes a material having a lower etch rate than that of SiN, for example, SiBN, SiCN, or SiBCN, or a combination thereof so that the spacer 104 can finally have an uniform thickness in an upper portion and a lower portion after performing the subsequent process and the contact pad 106 can have a substantially rectangular cross-section.

Referring to FIG. 3A, in the comparative example, the spacer 14 has a thickness decreasing along an upward direction from a top surface of the contact plug 15. Since the contact pad 16 has a thickness increasing along an upward direction from a top surface of the contact plug 15, if a difference of step heights occurs in a subsequent CMP process, a CD variation is caused or becomes greater by the difference of step heights and thus, W1 becomes smaller than W2 (W1<W2). Such a CD variation may result in a resistance variation of the variable resistance element and deteriorate characteristics of the variable resistance element. In contrary, in the implementation of the disclosed technology as shown in FIG. 3B, the spacer 104 has a uniform thickness along a vertical direction from a top surface of the contact plug 105. Since the contact pad 106 has a uniform thickness along a vertical direction from a top surface of the contact plug 105, although a difference of step heights occurs in a subsequent CMP process, a CD variation may not occur or may be minimized and thus W3 becomes substantially the same as W4 (W3=W4). That is, unlike the case of FIG. 3A, the contact pad 106 of FIG. 3B which has a uniform thickness along a vertical direction makes it possible to prevent or minimize the CD variation.

Figure 4A:
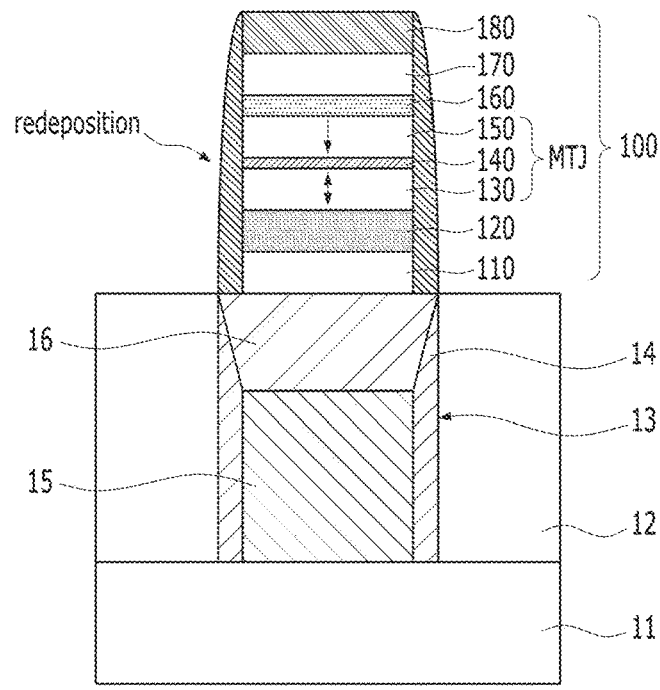
FIGS. 4A and 4B are cross-sectional views of memory devices including lower contact structures in accordance with a comparative example and one implementation of the present disclosure, which illustrate a re-deposition of a metallic residue in a subsequent MTJ (Magnetic Tunnel Junction) etch process.
Figure 4B:
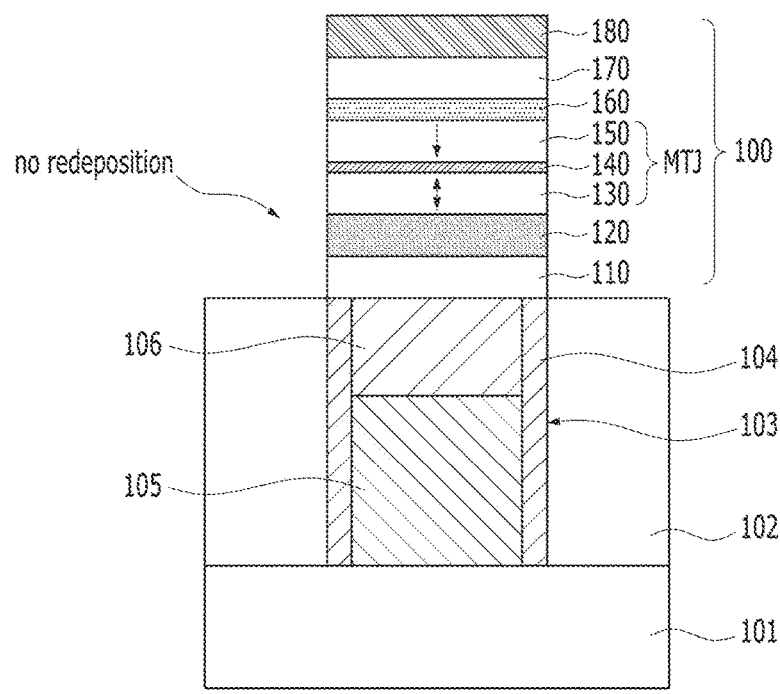

FIGS. 4A and 4B are cross-sectional views of memory devices including lower contact structures in accordance with a comparative example and one implementation of the present disclosure, which illustrate a re-deposition of a metallic residue in a subsequent MTJ (Magnetic Tunnel Junction) etch process. FIG. 4A shows the memory device in which the MTJ structure is formed over the lower contact structure in accordance with the comparative example as shown in FIGS. 1A to 1C, in which the material layer for the spacer 14 includes SiN so that an upper portion of the spacer 14 is partially removed after forming the subsequent process and thus an upper portion of the contact pad 16 has a greater width than that of the lower portion. FIG. 4B shows the memory device in which the MTJ structure is formed over the lower contact structure in accordance with the implementation of the disclosed technology, in which the material layer for the spacer 104 includes a material having a lower etch rate than that of SiN, for example, SiBN, SiCN, or SiBCN, or a combination thereof so that the final spacer 104 can have the upper portion and the lower portion that have an uniform thickness after performing the subsequent process and the contact pad 106 can have a substantially rectangular cross-section.

Referring to FIG. 4A, in the comparative example, since the upper portion of the lower contact structure, for example, the lower contact pad 16, has a greater width than that of a lower portion, a metallic residue may be re-deposited on the sidewalls of the MTJ structure due to an influence of a physical etch process during etching the MTJ structure. Such re-deposition of the metallic residue may cause a shunt failure which is fatal to driving the variable resistance element. In contrary, in the implementation of the disclosed technology as shown in FIG. 4B, the lower contact structure, for example, the lower contact pad 106, has a substantially rectangular shape, although the etch process for the MTJ structure is performed, a metallic residue may not be re-deposited so as to prevent or minimize a shunt failure.

In addition to the advantages described above, further advantages which can be obtained by forming the spacer 104 from the material layer including SiBN, or SiBCN, or a combination thereof will be explained in detail with reference to FIG. 5.

Figure 5:
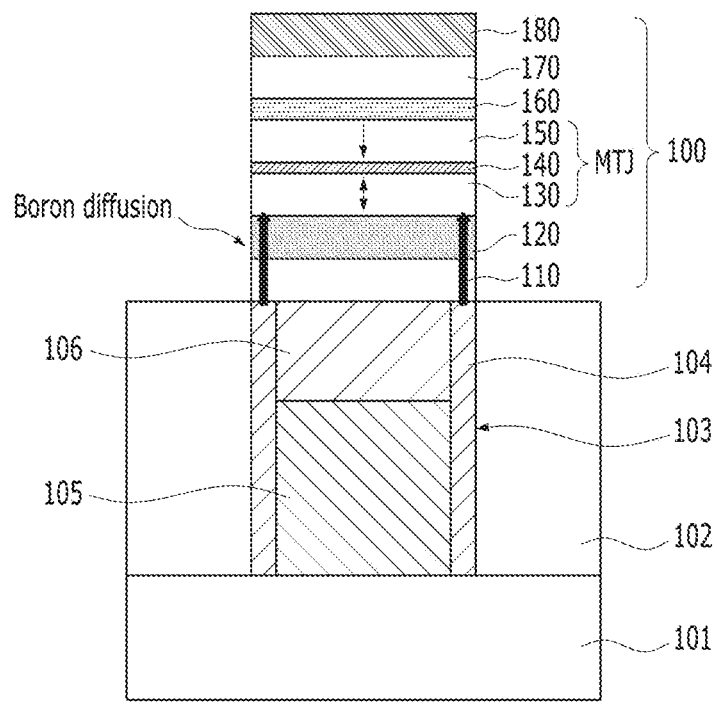
FIG. 5 is a cross-sectional view of a memory device including a lower contact structure in accordance with an implementation, which illustrates a boron diffusion to a lower edge of an MTJ structure.

FIG. 5 is a cross-sectional view of a memory device including a lower contact structure in accordance with an implementation, which illustrates a boron diffusion to a lower edge of an MTJ structure. Arrows in FIG. 5 conceptually indicate a boron diffusion to a lower edge of an MTJ structure, not to restrictedly indicate the diffusion height or the like.

It may be expected that a Ku value (perpendicular magnetic anisotropy) will be lowered by boron implantation at the lower edge of the MTJ structure after performing an etch process for MTJ structure, thereby improving WER0 (write error rate). However, when processes such as an ion implantation are used, boron is implanted not only in the lower edge portion of the MTJ structure but also in the entire region of the MTJ structure so that it is likely to cause undesirable side effects.

In this context, referring to FIG. 5, when a deposition process of material layers and an etch process for forming the MTJ structure are performed, the spacer 104 may become in contact with the lower edge portion of the MTJ structure so that boron may diffuse to the lower edge portion of the MTJ structure. Accordingly, in accordance with the implementation, by forming the spacer 104 from a material layer including SiBN, or SiBCN, or a combination thereof, it is possible to implant boron into only the lower edge portion of the MTJ structure, thereby decreasing the Ku value and improving WER0.

Moreover, when the spacer 104 includes SiBN which has a superior insulation property than SiN, shunt pass of the variable resistance element can be prevented or minimized so that characteristics of the variable resistance element can be improved.

A method for fabricating the lower contact structure in accordance with the implementation will be exemplarily described with reference to FIGS. 6A to 6C.

Figure 6A:
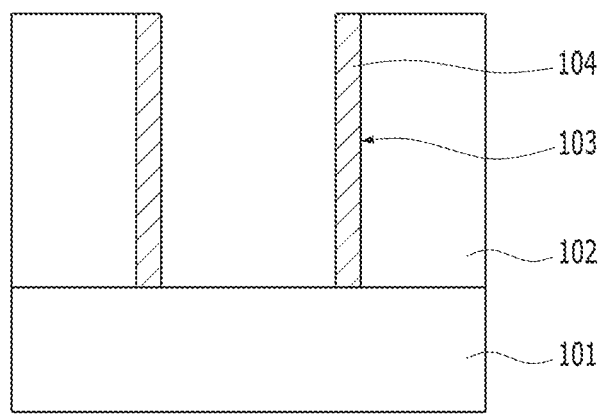
FIGS. 6A to 6C are cross-sectional views illustrating an example of a method for fabricating a lower contact structure in accordance with an implementation of the present disclosure.
Figure 6B:
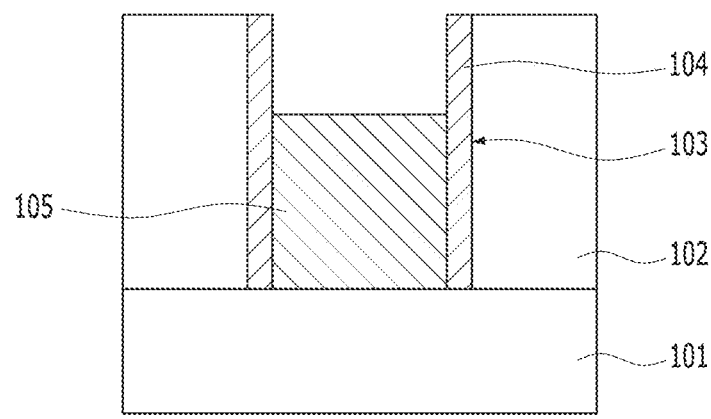
Figure 6C:
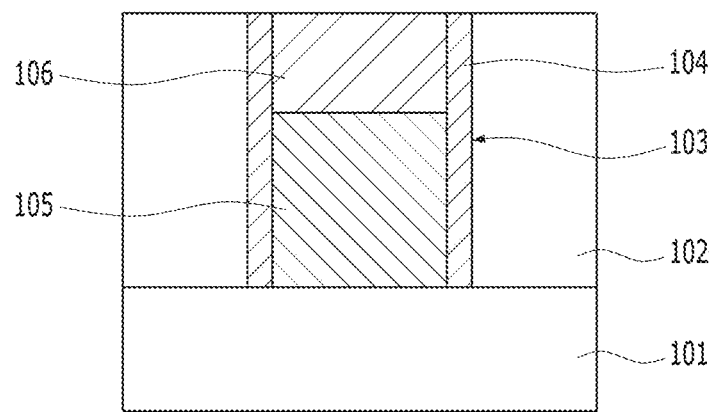

FIGS. 6A to 6C are cross-sectional views illustrating an example of a method for fabricating a lower contact structure in accordance with an implementation of the present disclosure.

Referring to FIG. 6A, an interlayer dielectric layer 102 may be formed over a substrate 101 where a predetermined structure, for example, a switching element (not shown) is formed. The interlayer dielectric layer 102 may include a single-layer or a multilayer including an oxide layer, a nitride layer, or an oxynitride layer.

Then, the interlayer dielectric layer 102 may be selectively etched to form a contact hole 103 exposing a portion of the substrate 101. Subsequently, a spacer 104 may be formed on sidewalls of the contact hole 103. The spacer 104 may be formed by depositing a material layer including a material having a lower etch rate than that of SiN, for example, SiBN, SiCN, or SiBCN, or a combination thereof.

Referring to FIG. 6B, a contact plug 105 filling a portion of the contact hole 103 in which the spacer 104 is formed may be formed. The contact plug 105 may be formed by depositing a conductive material on a front surface of the substrate 101 so as to fill the contact hole 103, removing a portion of the conductive material by performing an etch-back process until the conductive material has a desired thickness and then performing a cleaning process. The contact plug 105 may include a metal-containing material having an excellent filling property and high electrical conductivity. For example, the contact plug 105 may include tungsten (W) or titanium nitride (TiN).

In the implementation, since the spacer 104 includes a material having a lower etch rate than that of SiN, for example, SiBN, SiCN, or SiBCN, or a combination thereof, it is possible to prevent or minimize the loss of the upper portion of the spacer 104 during the etch-back process and the cleaning process for forming the contact plug 105. The final spacer 104 may have a substantially uniform thickness in its upper portion and its lower portion. Thus, the contact hole 103 may have a substantially uniform thickness in its upper portion and its lower portion, and have a substantially rectangular cross-section.

Referring to FIG. 6C, a contact pad 106 filling a remaining portion of the contact hole 103 may be formed over the contact plug 105. The contact pad 106 may include a material layer having various purposes, for example, a material layer for serving as a lower electrode of a variable resistance element 100 to be formed over the contact pad 106 through a subsequent process, improving characteristics of the variable resistance element 100, or facilitating processes, or the like. For example, the contact pad 106 may include a tantalum-containing layer, such as a tantalum layer.

The contact pad 106 may be formed by forming a metal-containing layer on a front surface of the substrate 101 so as to fill a remaining portion of the contact hole 103, and then performing a planarization process for the metal-containing layer until a surface of the interlayer dielectric layer 102 is exposed. Here, the planarization process may be performed in order to electrically separate the adjacent contact pads 106 from each other and planarize a surface of the contact pad 106. The planarization process may include a chemical mechanical polishing (CMP) process. Since the variable resistance element 100 is formed over the contact pad 106 through the subsequent process, as the surface of the contact pad 106 is more planar, the variable resistance element 100 may have more excellent characteristics. Moreover, although a difference of step heights occurs during the CMP process, since the lower contact structure has a substantially rectangular cross-section having a uniform thickness in the upper portion and the lower portion, a CD variation due to the difference of step heights or a resistance variation of the MTJ device can be prevented or minimized. Moreover, it is possible to decrease a shunt failure due to metal redeposition during etching the MTJ structure.

The variable resistance element 100 may be formed over the lower contact structure having a rectangular shape. A semiconductor memory device based on the variable resistance element 100 as disclosed in this document may include a cell array of such variable resistance elements 100 to store data. The semiconductor memory may further include various components such as lines, elements, etc. to drive or control each variable resistance element 100. This will be exemplarily explained with reference to FIGS. 7A and 7B.

Figure 7A:
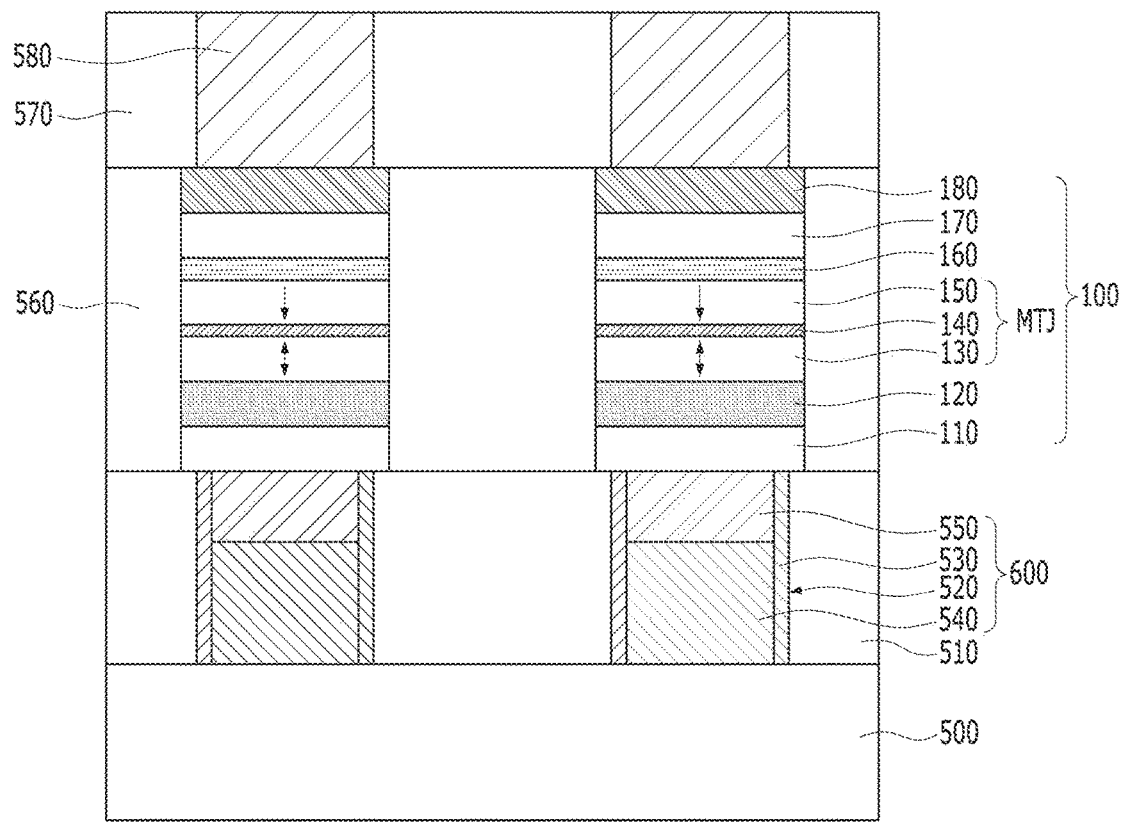
FIG. 7A is a cross-sectional view for explaining a memory device and a method for fabricating the same in accordance with an implementation of the present disclosure.

FIG. 7A is a cross-sectional view for explaining an example of a memory device in accordance with an implementation of the present disclosure and a method for fabricating the same.

Referring to FIG. 7A, the memory device of the implementation may include a substrate 500, lower contact structures 600 formed over the substrate 500, variable resistance elements 100 formed over the lower contact structures 600 and upper contacts 580 formed over the variable resistance element 100. For each variable resistance element 100, a specific structure as a switch or switching circuit/element, for example, a transistor, for controlling an access to a particular variable resistance element 100 can be provided over the substrate 500 to control the variable resistance element 100, where the switch can be turned on to select the variable resistance element 100 or turned off to de-select the variable resistance element 100. The lower contact structure 600 may be disposed over the substrate 500, and couple a lower end of the variable resistance element 100 to a portion of the substrate 500, for example, a drain of the transistor as the switching circuit for the variable resistance element 100. The upper contact 580 may be disposed over the variable resistance element 100, and couple an upper end of the variable resistance element 100 to a certain line (not shown), for example, a bit line. In FIG. 6A, two variable resistance elements 100 are shown as examples of the elements in an array of variable resistance elements 100.

The above memory device may be fabricated by following processes.

First, the substrate 500 in which the transistor or the like is formed may be provided, and then, a first interlayer dielectric layer 510 may be formed over the substrate 500. Then, the first interlayer dielectric layer 510 may be selectively etched to form a hole 520 exposing a portion of the substrate 500 and a material layer for a spacer 530 may be formed on sidewalls of the hole 520. Here, the material layer for the spacer 530 may include a material having a lower etch rate than that of SiN, for example, SiBN, SiCN, or SiBCN, or a combination thereof. Then, a contact plug 540 filling a portion of the hole 520 may be formed. For example, the contact plug 540 may be formed by forming a material layer for contact plug 540 so as to fill a portion of the hole 520, removing the material layer by performing an etch-back process until the material layer has a desired thickness, and then performing a cleaning process. Although the etch-back process and the cleaning process for forming the contact plug 540 are performed, the loss of the material layer for the spacer 530 can be prevented or minimized so that the final spacer 530 may have a substantially rectangular cross-section having a uniform thickness in its upper portion and its lower portion. Then, a contact pad 550 filling a remaining part of the hole 520 may be formed over the contact plug. For example, the contact pad 550 may be formed by forming a conductive material covering the resultant structure in which the contact plug 540 is formed, and then performing a planarization process such as a CMP process until a top surface of the first interlayer dielectric layer 510 is exposed. The lower contact structure 600 may have a substantially rectangular cross-section having a uniform thickness in the upper portion and the lower portion. Then, the variable resistance element 100 may be formed by forming material layers for forming the variable resistance element 100 over the lower contact structure 600 and the first interlayer dielectric layer 510, and then selectively etching the material layers. A second interlayer dielectric layer 560 may be formed by filling spaces between the variable resistance elements 100 with an insulating material.

Subsequently, a third interlayer dielectric layer 570 may be formed over the variable resistance element 100 and the second interlayer dielectric layer 560 and then, the upper contact 580 passing through the third interlayer dielectric layer 570 and coupled to the variable resistance element 100 may be formed.

In the memory device in accordance with this implementation, all layers forming the variable resistance element 100 may have sidewalls which are aligned with one another. That is because the variable resistance element 100 is formed through an etching process using one mask.

Unlike the implementation of FIG. 7A, a part of the variable resistance element 100 may be patterned separately from other parts. This process is illustrated in FIG. 7B.

Figure 7B:
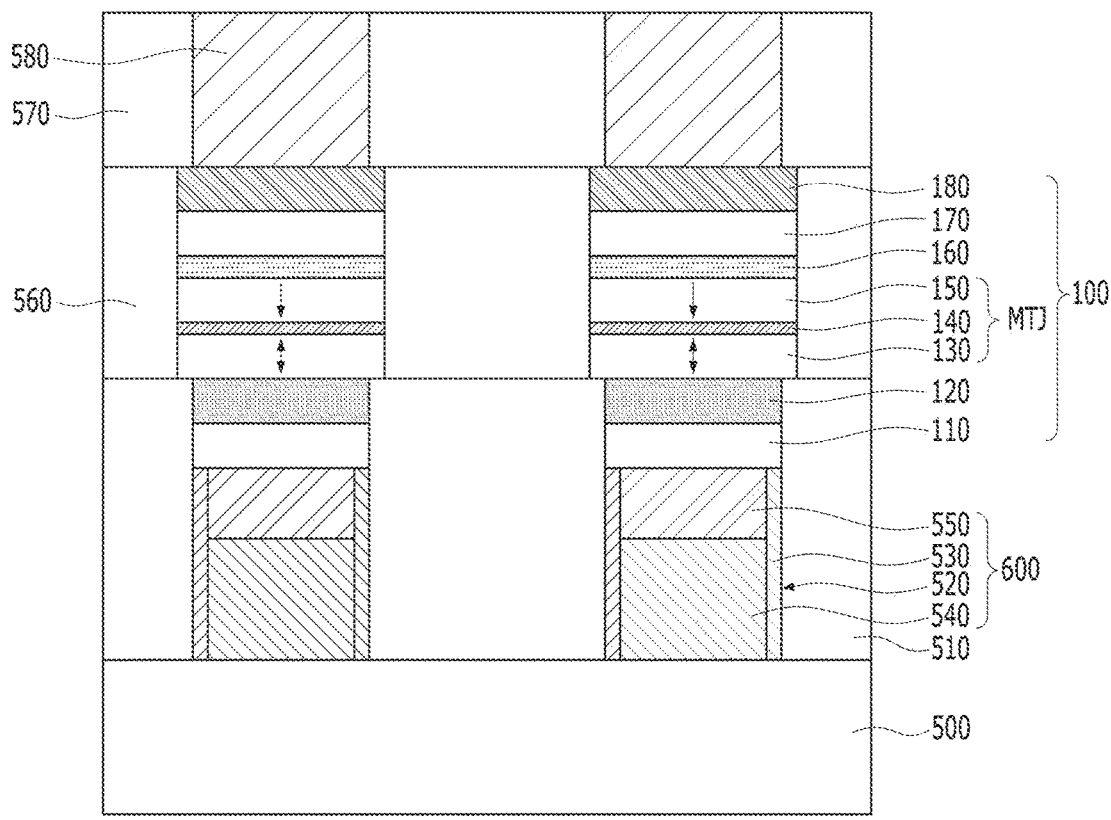
FIG. 7B is a cross-sectional view for explaining a memory device and a method for fabricating the same in accordance with another implementation of the present disclosure.

FIG. 7B is a cross-sectional view for explaining a memory device having variable resistance elements and a method for fabricating the same in accordance with an implementation of the present disclosure. The following descriptions will be focused on a difference from the implementation of FIG. 7A Referring to FIG. 7B, the memory device in accordance with this implementation may include a variable resistance element 100 having some parts, for example, a buffer layer 110 and a under layer 120, with sidewalls that are not aligned with the other layers thereof. As shown in FIG. 7B, the buffer layer 110 and the under layer 120 may have sidewalls which are aligned with a lower contact structure 600.

The memory device in FIG. 7B may be fabricated by following processes.

First, a first interlayer dielectric layer 510 may be formed over a substrate 500, and then selectively etched to form a hole 520 which exposes a portion of the substrate 500. Then, a spacer 530, a contact plug 540 and a contact pad 550 may be sequentially formed. The spacer 530, the contact plug 540 and the contact pad 550 may be formed as described with reference to FIG. 7A. The contact pad 550 may be formed so as to fill a portion of the hole 520. For example, the contact pad 550 may be formed by forming a conductive material which covers the resultant structure in which the contact plug 540 is formed and removing a portion of the conductive material by, for example, an etch-back process until the conductive material has a desired thickness. Then, a buffer layer 110 and an under layer 120 may be formed so as to fill a remaining portion of the hole 520 in which the lower contact structure 600 is formed. For example, the buffer layer 110 may be formed by forming a material layer for forming the buffer layer 110 which covers the resultant structure in which the lower contact structure 600 is formed, and then removing a portion of the material layer by, for example, an etch-back process until the material layer has a desired thickness. Moreover, the under layer 120 may be formed by forming a material layer for forming the under layer 120 which covers the resultant structure in which the lower contact structure 600 and the buffer layer 110 are formed, and then performing a planarization process such as a CMP process until a top surface of the first interlayer dielectric layer 510 is exposed. Then, remaining parts of the variable resistance element 100 may be formed by forming material layers for forming remaining layers of the variable resistance element 100 except the buffer layer 110 and the under layer 120 over the lower contact structure 600 and the first interlayer dielectric layer 510, and then selectively etching the material layers. Subsequent processes are substantially the same as those as shown in FIG. 7A.

In this implementation, the height which needs to be etched at a time in order to form the variable resistance element 100 can be reduced, which makes it possible to lower the difficulty level of the etching process.

Although in this implementation, the buffer layer 110 and the under layer 120 are buried in the hole 520, other parts of the variable resistance element 100 may also be buried as needed.

The above and other memory circuits or semiconductor devices based on the disclosed technology can be used in a range of devices or systems. FIGS. 8 to 12 provide some examples of devices or systems that can implement the memory circuits disclosed herein.

Figure 8:
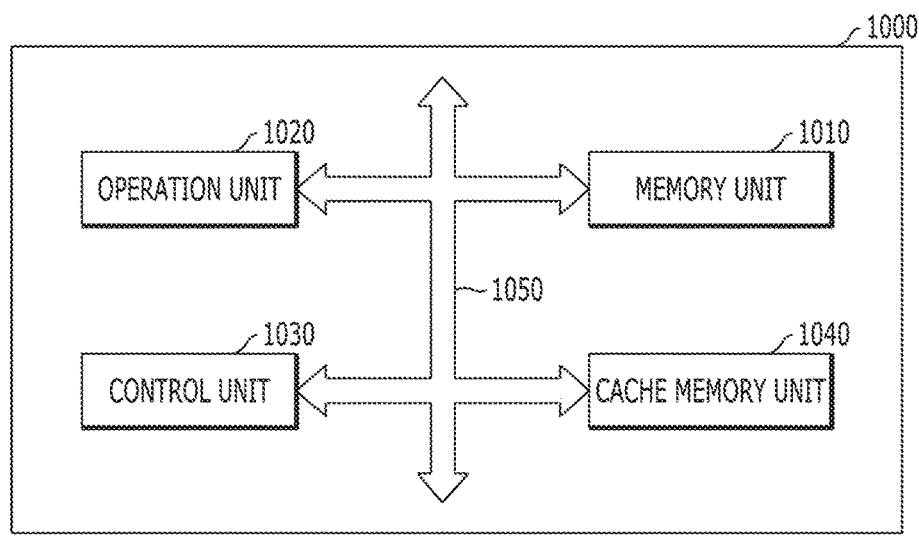
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate; an interlayer dielectric layer formed over the substrate and patterned to include a contact hole; a lower contact structure formed over the substrate in the contact hole; and a variable resistance element formed over and electrically coupled to the lower contact structure, wherein the lower contact structure may include: a spacer formed on sidewalls of the contact hole in the interlayer dielectric layer and including a material having a lower etch rate than that of silicon nitride (SiN); a contact plug filling a portion of the contact hole; and a contact pad formed over the contact plug and filling a remaining portion of the contact hole. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
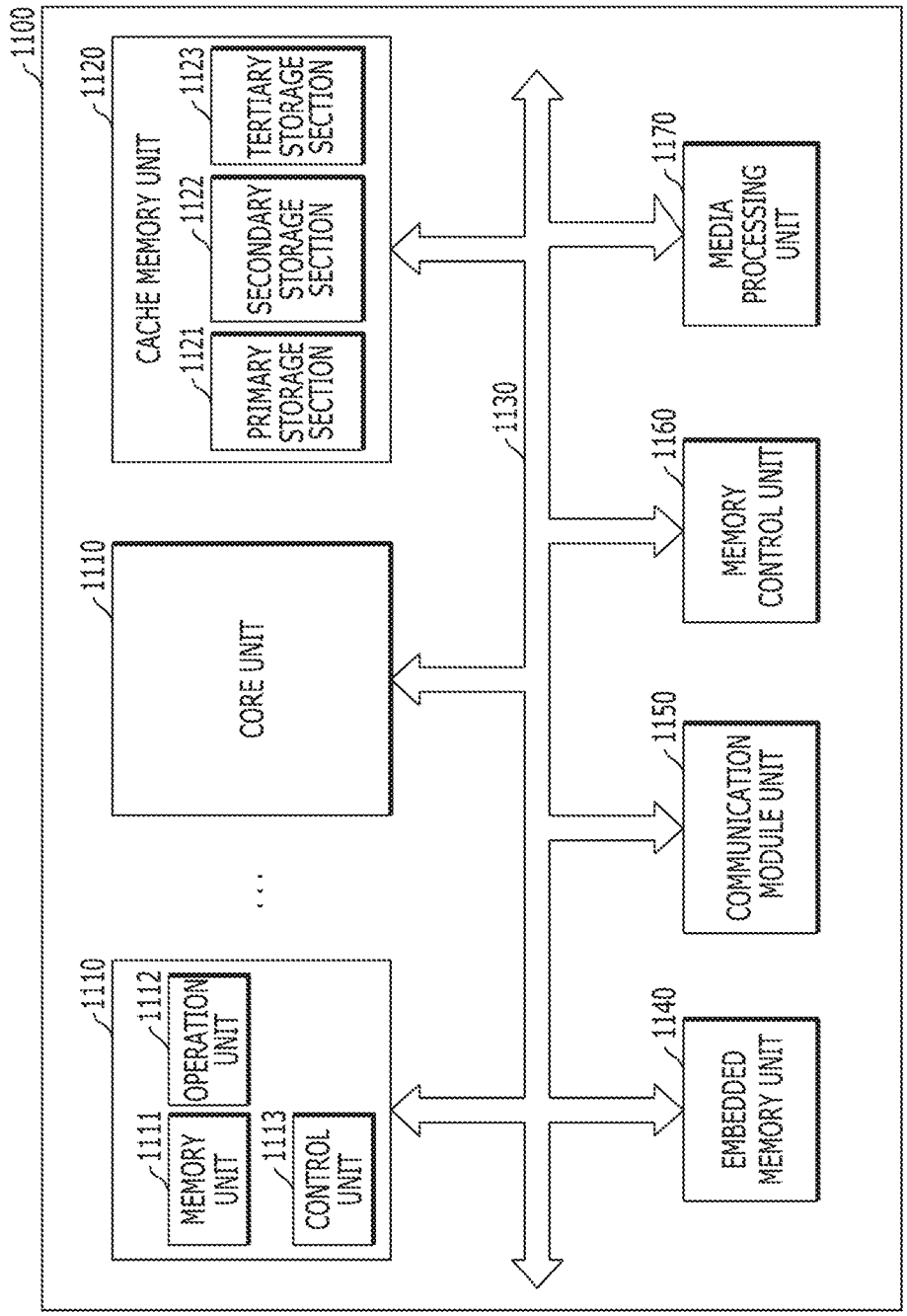
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate; an interlayer dielectric layer formed over the substrate and patterned to include a contact hole; a lower contact structure formed over the substrate in the contact hole; and a variable resistance element formed over and electrically coupled to the lower contact structure, wherein the lower contact structure may include: a spacer formed on sidewalls of the contact hole in the interlayer dielectric layer and including a material having a lower etch rate than that of silicon nitride (SiN); a contact plug filling a portion of the contact hole; and a contact pad formed over the contact plug and filling a remaining portion of the contact hole. Through this, data storage characteristics of the cache memory unit 1120 may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
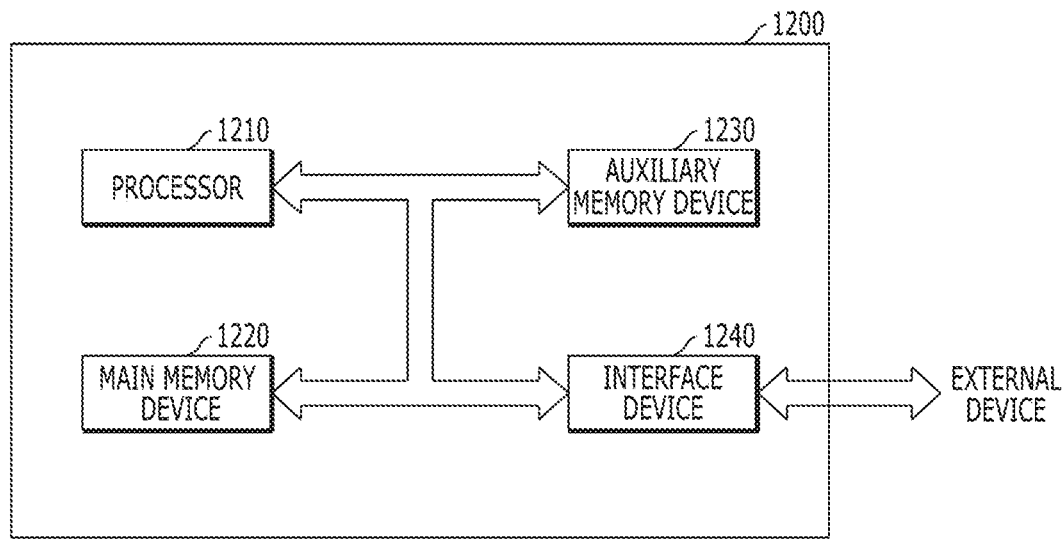
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an MTJ (Magnetic Tunnel Junction) structure including a free layer having a variable magnetization direction, a pinned layer having a fixed magnetization direction, and a tunnel barrier layer interposed therebetween; and an under layer formed under the MTJ structure, wherein the under layer may include oxides of surplus metals which are derived from materials included in the under layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate; an interlayer dielectric layer formed over the substrate and patterned to include a contact hole; a lower contact structure formed over the substrate in the contact hole; and a variable resistance element formed over and electrically coupled to the lower contact structure, wherein the lower contact structure may include: a spacer formed on sidewalls of the contact hole in the interlayer dielectric layer and including a material having a lower etch rate than that of silicon nitride (SiN); a contact plug filling a portion of the contact hole; and a contact pad formed over the contact plug and filling a remaining portion of the contact hole. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
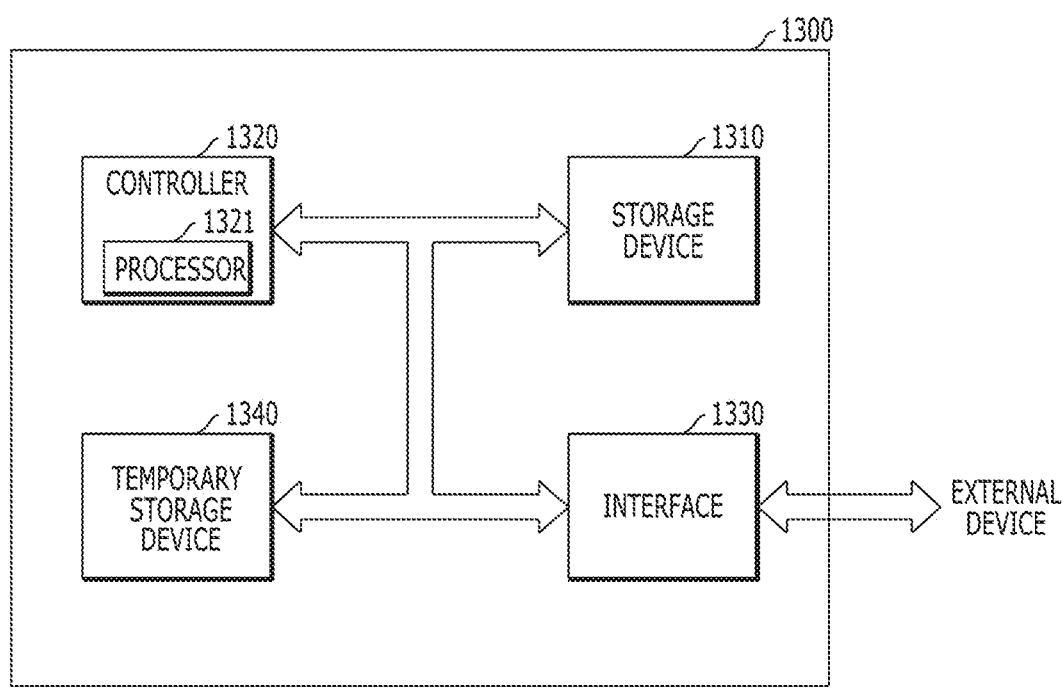
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate; an interlayer dielectric layer formed over the substrate and patterned to include a contact hole; a lower contact structure formed over the substrate in the contact hole; and a variable resistance element formed over and electrically coupled to the lower contact structure, wherein the lower contact structure may include: a spacer formed on sidewalls of the contact hole in the interlayer dielectric layer and including a material having a lower etch rate than that of silicon nitride (SiN); a contact plug filling a portion of the contact hole; and a contact pad formed over the contact plug and filling a remaining portion of the contact hole. Through this, data storage characteristics of the storage device 1310 or the temporary storage device 1340 may be improved. As a consequence, operating characteristics and data storage characteristics of the data storage system 1300 may be improved.

Figure 12:
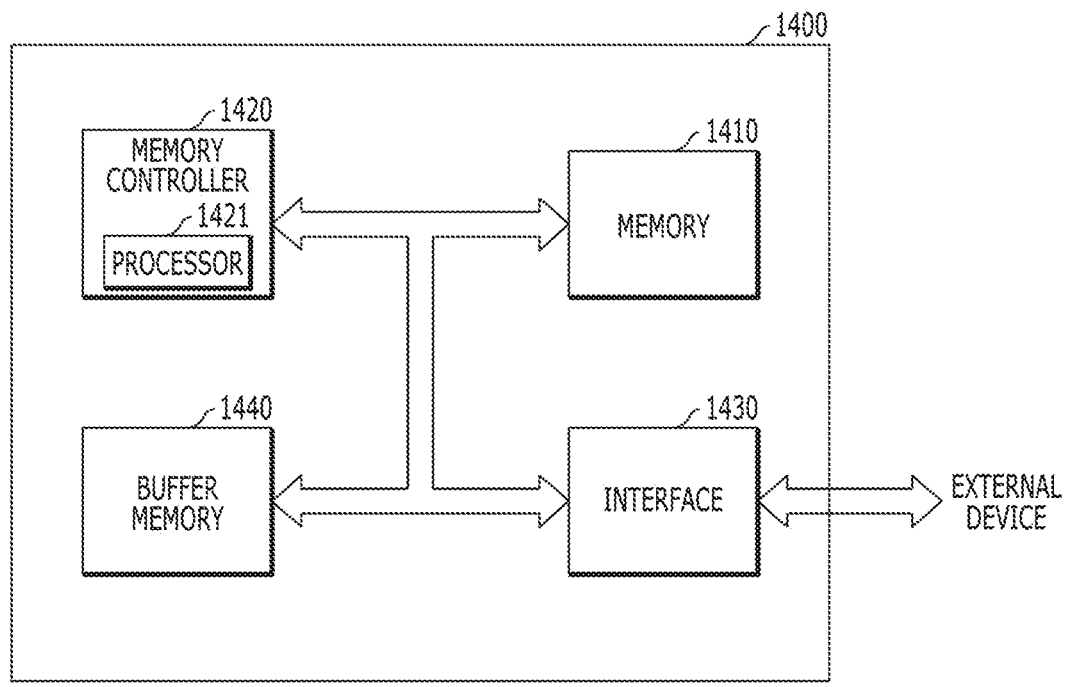
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate; an interlayer dielectric layer formed over the substrate and patterned to include a contact hole; a lower contact structure formed over the substrate in the contact hole; and a variable resistance element formed over and electrically coupled to the lower contact structure, wherein the lower contact structure may include: a spacer formed on sidewalls of the contact hole in the interlayer dielectric layer and including a material having a lower etch rate than that of silicon nitride (SiN); a contact plug filling a portion of the contact hole; and a contact pad formed over the contact plug and filling a remaining portion of the contact hole. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate; an interlayer dielectric layer formed over the substrate and patterned to include a contact hole; a lower contact structure formed over the substrate in the contact hole; and a variable resistance element formed over and electrically coupled to the lower contact structure, wherein the lower contact structure may include: a spacer formed on sidewalls of the contact hole in the interlayer dielectric layer and including a material having a lower etch rate than that of silicon nitride (SiN); a contact plug filling a portion of the contact hole; and a contact pad formed over the contact plug and filling a remaining portion of the contact hole. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a substrate;
   an interlayer dielectric layer formed over the substrate and patterned to include a contact hole;
   a lower contact structure formed over the substrate in the contact hole; and
   a variable resistance element formed over and electrically coupled to the lower contact structure and including an MTJ (Magnetic Tunnel Junction) structure,
   wherein the lower contact structure comprises:
   a spacer formed on sidewalls of the contact hole in the interlayer dielectric layer and including a material having a lower etch rate than that of silicon nitride (SiN);
   a contact plug filling a portion of the contact hole; and
   a contact pad formed over the contact plug and filling a remaining portion of the contact hole,
   wherein the MTJ structure includes boron in a lower portion of the MTJ structure, the boron being diffused from the spacer.

2. The electronic device of claim 1, wherein the variable resistance element includes an MTJ (magnetic tunnel junction) structure including a free layer having a variable magnetization direction, a pinned layer having a fixed magnetization direction and a tunnel barrier layer interposed between the free layer and the pinned layer.

3. The electronic device of claim 2, wherein the spacer is in contact with the MTJ structure at a lower portion of the MTJ structure.

4. The electronic device of claim 2, wherein the spacer includes SiBN, SiCN, or SiBCN, or a combination thereof.

5. The electronic device of claim 1, wherein the spacer has a substantially uniform thickness along a direction perpendicular to a surface of the substrate.

6. The electronic device of claim 1, wherein the contact plug and the contact pad include a metal-containing material.

7. The electronic device of claim 1, wherein the contact plug includes tungsten (W), or titanium nitride (TiN), or a combination thereof, and the contact pad includes tantalum (Ta).

8. An electronic device comprising a semiconductor memory, wherein the semiconductor memory comprises:
   a substrate;
   a lower contact structure formed over the substrate;
   a spacer formed on a sidewall of the lower contact structures and having a thickness that is uniform along a direction perpendicular to a surface of the substrate; and
   a variable resistance element formed over and electrically coupled to the lower contact structure and including an MTJ (Magnetic Tunnel Junction) structure, the variable resistance element configured to exhibit different resistance values depending on a direction of current flowing through the variable resistance element,
   wherein the MTJ structure includes boron in a lower portion of the MTJ structure, the boron being diffused from the spacer.

9. The electronic device of claim 8, wherein the spacer includes a material having a lower etch rate than that of silicon nitride (SiN).

10. The electronic device of claim 8, wherein the spacer has a substantially rectangular cross-section.

11. The electronic device of claim 8, wherein the spacer includes SiBN, SiCN, or SiBCN, or a combination thereof.

12. The electronic device of claim 8, wherein the variable resistance element includes a free layer having a variable magnetization direction, a pinned layer having a fixed magnetization direction and a tunnel barrier layer interposed between the free layer and the pinned layer.

* * * * *